(12) United States Patent
Date et al.

(10) Patent No.: US 6,576,081 B2
(45) Date of Patent: *Jun. 10, 2003

(54) ADHESIVE, BONDING METHOD AND ASSEMBLY OF MOUNTING SUBSTRATE

(75) Inventors: Hiroaki Date, Kawasaki (JP); Yuko Motoyama, Kawasaki (JP); Hideshi Tokuhira, Kawasaki (JP); Makoto Usui, Kawasaki (JP); Nobuhiro Imaizumi, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/438,665

(22) Filed: Nov. 12, 1999

(65) Prior Publication Data

US 2002/0084019 A1 Jul. 4, 2002

Related U.S. Application Data

(63) Continuation of application No. PCT/JP98/02082, filed on May 11, 1998.

(30) Foreign Application Priority Data

May 12, 1997 (JP) .............................. 9-120587
Dec. 12, 1997 (JP) .............................. 9-343249

(51) Int. Cl.$^7$ .............................. C09J 9/02; C09J 5/00; C09J 5/04
(52) U.S. Cl. .............................. 156/310; 156/330; 523/202; 523/206; 523/211; 525/451
(58) Field of Search .............................. 156/310, 330; 523/202, 206, 211

(56) References Cited

U.S. PATENT DOCUMENTS

| | | | | |
|---|---|---|---|---|
| 2,824,851 A | * | 2/1958 | Hall | 525/531 |
| 4,426,243 A | * | 1/1984 | Briggs | 156/310 |
| 5,043,102 A | | 8/1991 | Chen et al. | |
| 5,330,844 A | * | 7/1994 | Taguchi et al. | 523/202 |
| 5,843,251 A | * | 12/1998 | Tsukagoshi et al. | 523/211 |
| 6,080,443 A | * | 6/2000 | Date et al. | 523/202 |

FOREIGN PATENT DOCUMENTS

| | | | | |
|---|---|---|---|---|
| EP | 0 218 364 | | 4/1987 | |
| JP | 4-100878 | | 4/1992 | |
| JP | 5-17723 | * | 1/1993 | 523/211 |
| JP | 5-321920 | | 12/1993 | |
| JP | 6-88040 | | 3/1994 | |
| JP | 6-322350 | | 11/1994 | |
| JP | 7-252460 | | 10/1995 | |

OTHER PUBLICATIONS

JP 05–306379, Patent Abstracts of Japan, vol. 18, No. 114 (C–1171), Feb. 24, 1994 (Abstract Only).

SU 429 658 A, Database WPI, Section Ch., Week 198028, Derwent Publications Ltd., (XP002172070) (Abstract Only).

JP 55–048209 A, Database WPI, Section Ch., Week 198020, Derwent Publications Ltd., (XP 002172071) (Abstract Only).

* cited by examiner

*Primary Examiner*—Adrienne C. Johnstone
(74) *Attorney, Agent, or Firm*—Armstrong, Westerman & Hattori, LLP (57) ABSTRACT

The present invention is characterized by comprising a two-pack adhesive of an A agent selected from components, an acrylic monomer, a peroxide, a reducing agent, an epoxy resin precursor and a curing agent and containing at least one or two of the acrylic monomer, the peroxide and the reducing agent, and a B agent containing all of the remaining components which are not selected in the A agent. The use of this adhesive makes it possible to stably obtain the bonding free from a thermal stress with the excellent heat resistance and the good reliability.

12 Claims, 3 Drawing Sheets

ADHESIVE, BONDING METHOD AND ASSEMBLY OF MOUNTING SUBSTRATE

CROSS-REFERENCES TO RELATED APPLICATIONS

This application is a continuation of PCT/JP98/02082, filed May 11, 1998.

BACKGROUND OF THE INVENTION

1. Field of the Invention

The present invention relates to an adhesive, a bonding method and an assembly of a mounting substrate. More specifically, the present invention relates to a mixed adhesive comprising a redox polymerization-type acrylic adhesive and an epoxy adhesive, a bonding method using the same and an assembly of a mounti ng substrate. The adhesive and the bondi ng method according to the present invention can used to substitute a soldering method, and are especially useful to bond functional elements such as various electronic parts on a mounting substrate such as a wiring circuit substrate, a printed wiring substrate or the like.

2. Description of Related Art

In recent years, a semiconductor technology has been markedly developed. Functional elements such as high-performance IC, LSI and the like have been developed one after another, and the mass production has been continued. As a bonding method for mounting these functional elements on a mounting substrate, a soldering method has been known. However, according to the development of the semiconductor technology, various bonding methods other than the soldering method have been proposed, and are being put to practical use.

As a method other than the soldering method, a bonding method using a resin adhesive which can cope well with a fine circuit pattern formed on a mounting substrate, a working environment, an operational environment and the like and which can realize bonding with a high reliability has attracted much interest, and it has been partially put to practical use. Further, a conductive adhesive obtained by adding conductive fine particles to the above-mentioned adhesive has been known. For such an adhesive, it is required that stable bonding can be realized in which no thermal stress remains in a bonded portion after bonding.

Incidentally, when the bonding is conducted using the above-mentioned resin adhesive or conductive adhesive in place of the soldering, there are the following advantages.

That is, since a soldering material generally used in the soldering has a poor wettability with aluminum (Al) generally used as an electrode of a functional element to be bonded, a film for improving a wettability of a soldering material has to be formed in advance on the Al electrode. To this end, an extra film-forming step is required, involving a high cost. However, when the above-mentioned adhesive is used, such inconveniences are eliminated.

Further, since a melting point of a general soldering material is 183° C., the soldering has to be conducted at a temperature of higher than 183° C., generally higher than approximately 200° C. For this reason, there is a problem that a bonded portion undergoes a thermal stress. However, when, for example, an epoxy adhesive is used, the curing treatment can be conducted at approximately 150° C. which is a temperature lower than the soldering temperature. Thus, it is possible to reduce a thermal stress that the bonded portion undergoes.

A bonding method using a resin or conductive adhesive has, compared with the soldering method, a large number of advantages that, for example, (1) a thermal stress that a bonded portion undergoes by an adhesive is lower than a thermal stress that a soldered portion undergoes by the soldering method, (2) since the heat treatment at 200° C. or more as in the soldering method is not required, a heater capable of heating at this temperature is dispensed with, (3) it is unnecessary to design a mounting substrate so as to endure a high temperature, with a result that a production cost can be reduced, and (4) the bonding can be conducted without using Pb contained in the soldering material and having an adverse effect on environment.

Nevertheless, when a functional element is bonded to a mounting substrate using an ordinary adhesive, a special device such as a press having a heating mechanism is needed. Further, a thermal stress of a bonded portion is greater than that in the bonding at room temperature, though it is less than in the soldering. Especially, when a bonded portion is soft as in a substrate made of an organic material or a mounting substrate having a photosensitive resin laminated thereon, the substrate is much deformed at a high temperature in the bonding. Consequently, the reliability of the bonded portion comes to decrease.

Thus, for further improving the reliability of the bonded portion, it is required to more reduce the thermal stress that the bonded portion undergoes. To this end, an adhesive capable of bonding at room temperature and having a good reliability is needed.

Therefore, an acrylic adhesive comprising an A agent composed mainly of a methacrylic monomer made of ω-carboxy-polycaprolactone monoacrylate, an organic peroxide, a polymerization inhibitor and an elastomer and further containing an epoxy resin as a chlorine ion trapping agent and a B agent composed mainly of a reducing agent that forms a redox catalyst system with the organic peroxide of the A agent has been proposed as the above-mentioned resin adhesive capable of bonding at room temperature (Japanese Unexamined Patent Publication No. HEI 7(1995)-216310).

However, it has been known that the above-mentioned acrylic adhesive is inferior to the epoxy adhesive in an indirect fillability, a heat resistance and the like and has a low curing rate at room temperature. Accordingly, it is lacking in the reliability and the productivity as an adhesive for bonding a functional element to a mounting substrate.

SUMMARY OF THE INVENTION

It is an object of the present invention to provide, in view of the above-mentioned problems, a novel adhesive in which upon using a mixed adhesive obtained by combining a redox polymerization-type acrylic adhesive with an epoxy adhesive, a functional element can be fixed on a mounting substrate such as a wiring circuit substrate or the like at room temperature and then heat-cured to thereby minimize a thermal stress at the bonded portion and the heat resistance and the reliability of the bonded portion are excellent, a bonding method and an assembly of a mounting substrate.

Thus, according to the present invention, there is provided an adhesive comprising a two-pack adhesive of an A agent selected from components, an acrylic monomer, a peroxide, a reducing agent, an epoxy resin precursor and a curing agent and containing at least one or two of the acrylic monomer, the peroxide and the reducing agent, and a B agent containing all of the remaining components which are not selected in the A agent.

Further, according to the present invention, there is provided an adhesive comprising the adhesive is composed of anacrylicmonomer, aperoxide, areducingagent, anepoxyresin precursor and a curing agent, at least one of the acrylic monomer, the peroxide and the reducing agent being coated with a thermoplastic resin to form a microcapsule.

Still further, according to the present invention, there is provided a bonding method which is a method of bonding two members, comprising; coating an A agent selected from components, an acrylic monomer, a peroxide, a reducing agent, an epoxy resin precursor and a curing agent and containing at least one or two of the acrylic monomer, the peroxide and the reducing agent on one member, coating a B agent containing all of the remaining components which are not selected in the A agent on another member, fixing the two members so as to contact the coated surfaces, and then heat-curing the adhesive composed of the A agent and the B agent.

Furthermore, according to the present invention, there is provided a bonding method which is a method of bonding two members, comprising; coating an adhesive composed of an acrylic monomer, a peroxide, a reducing agent, fixing an epoxy resin precursor and a curing agent between the two members, the two members, and then heat-curing the adhesive.

Moreover, according to the present invention, there is provided an assembly of a mounting substrate in which pad portions of the mounting substrate and lead terminals of a functional element mounted thereon are electrically connected with an anisotropic conductive adhesive, characterized in that the anisotropic conductive adhesive is a two-pack adhesive of an A agent selected from components, an acrylic monomer, a peroxide, a reducing agent, an epoxy resin precursor, a curing agent and a microcapsule-type conductive filler obtained by coating conductive fine particles with an insulating resin and containing at least one or two of the acrylic monomer, the peroxide and the reducing agent, and a B agent containing all of the remaining components which are not selected in the A agent.

In addition, according to the present invention, there is provided an assembly of a mounting substrate in which pad portions of the mounting substrate and the lead terminals of a functional element mounted thereon are electrically connected with an anisotropic conductive adhesive, characterized in that the anisotropic conductive adhesive is an adhesive comprising an acrylic monomer, a peroxide, a reducing agent, an epoxy resin precursor, a curing agent and a microcapsule-type conductive filler obtained by coating conductive fine particles with an insulating resin, at least one of the acrylic monomer, the peroxide and the reducing agent being coated with a thermoplastic resin to form a microcapsule.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The adhesive and the bonding method of the present invention are suited for bonding two members, a functional element and a mounting substrate. The functional element is not particularly limited. For example, integrated circuit chips (IC, LSI and the like) are mentioned. Meanwhile, the mounting substrate is not particularly limited. For example, a wiring circuit substrate, a printed wiring board and the like are mentioned. In particular, the bonding method of the present invention is used in the bonding of electronic parts and/or a mounting substrate containing members that are thermally weak to bring forth especially preferable effects.

The acrylic monomer which can be used in the present invention is a term including both an acrylic monomer and a methacrylic monomer. As the acrylic monomer, any monomer that is used in an acrylic adhesive is usable. For example, ω-carboxy-polycaprolactone mono(meth)acrylate, (meth)acrylic acid, alkyl (meth)acrylate, hydroxyalkyl (meth)acrylate, phenoxyalkyl (meth)acrylate, cycloalkyl (meth)acrylate, tetrahydrofurfuryl (meth)acrylate, ethylene glycol tetrahydrofurfuryl (meth)acrylate, ethylene glycol di(meth)acrylate, and epoxy(meth)acrylate obtained by the addition reaction of an epoxy compound with meth(acrylic acid), a urethane (meth)acrylate obtained by the addition reaction of urethane with (meth)acrylic acid, a polyester (meth)acrylate obtained by the addition reaction of a polyester with (meth)acrylic acid, and a (meth)acrylate of an alkylene oxide adduct of bisphenol A and the like are mentioned. In the above-mentioned illustration, as the alkyl, methyl, ethyl, propyl, butyl, pentyl, hexyl and the like are mentioned. As the hydroxalkyl, hydroxethyl, hydroxpropyl and the like are mentioned. As the cycloalkyl, cyclopropyl, cyclobutyl, cyclopentyl, cyclohexyl and the like are mentioned. These (meth)acrylic monomers may be used either singly or in the admixture of two or more. Incidentally, in the present specification, (meth)acrylic is used as a term referring to both acrylic and methacrylic, and a (meth)acrylate as a term referring to both an acrylate and a methacrylate.

Next, as the peroxide, any peroxide that is used in an acrylic adhesive is usable. For example, benzoyl peroxide, cumene hydroxyperoxide, methyl ethyl ketone peroxide, dicumyl peroxide, t-butyl peroxybenzoate, butyl hydroxyperoxide and the like are mentioned. These peroxides may be used either singly or in admixture of two or more. Especially preferable peroxides are benzoyl peroxide and cumene hydroperoxide.

Further, as the reducing agent, any reducing agent that is used in an acrylic adhesive is usable. For example, triethylamine, tripropylamine, tributylamine, ethylenediethanolamine, N,N-dimethylaniline, N,N-dimethyltoluidine, methylthiourea, diethylthiourea, acetylthiourea, tetramethylthiourea, ethylenethiourea, methyl ethyl ketone oxime, methyl isobutyl ketone oxime, acetophenone oxime, p,p'-dibenzoylquinone dioxime, cobalt naphthenate, copper naphthenate, manganese naphthenate, nickel naphthenate, iron naphthenate, vanadyl acetylacetonate, titanium acetylacetonate, cobalt sulfide, copper sulfide, manganese sulfide, nickel sulfide, iron sulfide and the like are mentioned. These reducing agents may be used either singly or in admixture of two or more. Especially preferable reducing agents are dimethylaniline and ferrous sulfide.

Further, especially preferable combinations of the peroxide and the reducing agent are benzoyl peroxide and dimethylaniline, and cumene hydroperoxide and ferrous sulfide.

The proportions of the (meth)acrylic monomer, the peroxide and the reducing agent used are determined, as required, depending on the types of the (meth)acrylic monomer, the peroxide and the reducing agent. Usually, it is advisable to use, per 100 parts by weight of the (meth)acrylic monomer, from 0.01 to 100 parts by weight of the peroxide and from 0.01 to 100 parts by weight of the reducing agent. When the proportion of the peroxide used is less than 0.01 parts by weight, the (meth)acrylic monomer is not reacted satisfactorily. Thus, it is undesirable. When it is more than 100 parts by weight, the peroxide that does not participate in the reaction remains in a large amount. Thus, it is undesirable. Further, when the proportion of the reducing agent used is less than 0.01 parts by weight, the (meth)acrylic monomer is not reacted satisfactorily. Thus, it is undesirable. When it is more than 100 parts by weight, the reducing agent that does not participate in the reaction remains in a large amount. Thus, it is undesirable. Incidentally, the more preferable proportions of the peroxide and the reducing agent are between 1 and 20 parts by weight and between 1 and 20 parts by weight respectively.

As the epoxy resin precursor, any epoxy resin precursor that is used in the epoxy adhesive is usable. For example, a bisphenol A-type, bisphenol F-type or a naphthalene-type epoxy resin precursor is mentioned. The epoxy resin precursor here means an epoxy resin having a relatively low molecular weight, which becomes a high-molecular-weight epoxy resin by crosslinking through curing.

Next, as the curing agent, any curing agent that is used in an epoxy adhesive is usable. For example, acids such as phthalic acid, hexahydrophthalic acid, tetrahydrophthalic acid, methyltetrahydrophthalic acid, methylnadic acid, maleic acid, trimellitic acid, pyromellitic acid and the like, imidazole, dicyanediamide and the like are mentioned. Incidentally, as the above-mentioned acid, a mono- or di-anhydride is preferably used. These curing agents may be used either singly or in admixture of two or more.

The proportions of the epoxy resin precursor and the curing agent used are determined, as required, depending on the types of the epoxy resin precursor and the curing agent. For example, it is advisable to use from 1 to 100 parts by weight per 100 parts by weight of the epoxy resin precursor. When the proportion of the curing agent used is outside the above-mentioned range, the complete curing of the adhesive is hardly conducted. Thus, it is undesirable. Especially preferable is that the curing agent is contained in a proportion of approximately 10 parts by weight.

In the bonding method of the present invention, the components comprising the acrylic monomer, the peroxide, the reducing agent, the epoxy resin precursor and the curing agent are mixed in use to form a mixed adhesive. Here, with respect to the mixing proportions of the acrylic adhesive composed of the acrylic monomer, the peroxide and the reducing agent and the epoxy adhesive composed of the epoxy resin precursor and the curing agent, the acrylic adhesive is preferably between 20 and 500 parts by weight, especially preferably between 100 and 200 parts by weight per 100 parts by weight of the epoxy adhesive. When the mixing proportion of the acrylic adhesive is less than 20 parts by weight, no satisfactory fixing strength is obtained. Thus, it is undesirable. Meanwhile, when it is more than 500 parts by weight, a heat resistance of a bonded portion is poor, and a reliability is decreased. Thus, it is undesirable.

With respect to the (meth)acrylic monomer, the peroxide and the reducing agent which are components of the acrylic adhesive used in the present invention, at least one thereof is preferably coated with a thermoplastic resin. The adhesive can be cured when required by coating at least one thereof with the thermoplastic resin. As the above-mentioned thermoplastic resin for coating, a styrene resin, a (meth)acrylic resin, a polyester resin, a polyamide resin and the like are mentioned. The coating of the (meth)acrylic monomer, the peroxide and/or the reducing agent with the thermoplastic resin can be conducted by an interfacial polymerization method or an in-situ polymerization method. For example, it can be formed as follows. That is, first, an oily phase composed of a solvent, a starting material (for example, a styrene monomer) of a thermoplastic resin, and a (meth)acrylic monomer, a peroxide or a reducing agent is formed. Separately from this, an emulsifying agent is added to water to form an aqueous phase. To this aqueous phase, the above-mentioned oily phase is gradually added dropwise, and then dispersed with a stirrer such as a homogenizer to form a suspension. Subsequently, heat and a catalyst are added to the suspension, and the polymerization is conducted while stirring the starting material of the thermoplastic resin on the surface of the (meth)acrylic monomer, the peroxide or the reducing agent to coat the (meth)acrylic monomer, the peroxide or the reducing agent with the thermoplastic resin. The coating of the (meth)acrylic monomer with the thermoplastic resin is conducted in the presence of a polymerization initiator that does not polymerize the (meth)acrylic monomer but selectively polymerizes the starting material of the thermoplastic resin and/or in the presence of a polymerization inhibitor that selectively inhibits the polymerization of the (meth)acrylic monomer. Further, for the same reason as in the above-mentioned acrylic adhesive, it is preferable that the epoxy resin precursor and/or the curing agent, a component of the epoxy adhesive is coated with the thermoplastic resin. As the coating method, the same method as used in the acrylic adhesive can be employed.

In the present invention, the microcapsule-type conductive filler obtained by coating the conductive fine particles with the insulating resin may be added to the mixed adhesive. When the microcapsule-type conductive filler is added, conduction can be carried out by exerting a pressure on a portion requiring conduction in the bonding to break the microcapsule. Incidentally, in a portion on which no pressure is exerted, a microcapsule is not broken, thereby maintaining an insulating property. Such an adhesive containing the microcapsule-type conductive filler is called an anisotropic conductive adhesive.

The conductive fine particles are not particularly limited. Fine particles of metals such as silver, gold, copper, nickel, palladium, rhodium and the like, fine particles of alloys such as a silver-palladium alloy and the like, and powders of amorphous carbon, graphite and the like are mentioned. Meanwhile, as the insulating resin, a thermosetting resin is preferably used. Specifically, an epoxy resin, an epoxy-amine resin and the like are mentioned.

With respect to the conductive filler, the particle diameter is preferably between 2 and 12 $\mu$m. When it is less than 2 $\mu$m, unevenness of intervals in plural portions requiring the conduction cannot be alleviated, and poor conduction occurs. Thus, it is undesirable. Meanwhile, when it is more than 12 μm, there is a fear that an unnecessary portion might be rendered conductive. Thus, it is undesirable.

The coating of the conductive fine particles with the insulating resin can be formed as follows, for example. That is, an oily phase composed of a solvent, a starting material of an insulating resin and conductive fine particles is formed. Separately from this, an emulsifying agent is added to water to form an aqueous phase. To this aqueous phase, the above-mentioned oily phase is gradually added dropwise, and dispersed with a stirrer such as a homogenizer to form a suspension. Subsequently, heat and a catalyst are added to the suspension, and the polymerization is conducted while stirring the starting material of the insulating resin on the surfaces of the conductive fine particles, whereby the conductive fine particles can be coated with the insulating resin.

A filler (for example, alumina and aluminum nitride) may be added to the mixed adhesive used in the bonding method of the present invention. The proportion of the filler used is preferably between 1 and 80% by weight based on the mixed adhesive. It is especially preferably between 20 and 60% by weight.

To the mixed adhesive used in the bonding method of the present invention, additives such as an elastomer and a (meth) acrylic resin for enhancing a peel strength and an impact strength, a paraffin wax for increasing a surface curability of the adhesive, an antioxidant for increasing a stability, a plasticizer, a filler (for example, alumina and aluminum nitride), a coupling agent for improving an adhesion strength, a coloring agent and the like may be added as required.

Further, an organic solvent such as methylene chloride, carbon tetrachloride, methyl ethyl ketone, methyl isobutyl ketone, acetone, benzene, toluene, xylene, ethyl acetate, butyl acetate, n-hexane, cyclohexane or the like may be added as required.

The bonding method of the present invention is described below.

First, a case in which any of the (meth)acrylic monomer, the peroxide and the reducing agent constituting the acrylic adhesive is not coated with the thermoplastic resin is described.

In this case, for preventing the curing by the polymerization of the (meth)acrylic monomer, it is advisable that the (meth)acrylic monomer is not contacted with the reducing agent or the peroxide simultaneously until these are used. Accordingly, a method is ordinarily used in which the components are mixed in the bonding or a two-pack adhesive of the component (A agent) containing the (meth) acrylic monomer and the component (B agent) containing the reducing agent or the peroxide is previously prepared and the A agent and the B agent are mixed in the bonding. Further, it is advisable that the epoxy resin precursor and the curing agent constituting the epoxy adhesive are added to the above-mentioned A agent or B agent separately.

Incidentally, when the (meth)acrylic monomer and the peroxide are present at the same time, the curing of the (meth)acrylic monomer gradually proceeds. However, for controlling this curing, it is advisable to store the adhesive in a cold, dark position. Further, when the reducing agent, the peroxide and the curing agent are present at the same time, it is advisable to use them in such a combination that they are not reacted with one another. As such a combination, for example, a combination of dimethylaniline (reducing agent), benzoyl peroxide (peroxide) and imidazole (curing agent) is mentioned.

When the reducing agent and the peroxide are here present at the same time, the peroxide is converted to a radical. However, the present inventors have identified that this conversion to a radical does not influence a function of the peroxide that cures the (meth)acrylic monomer.

Figure 1A:
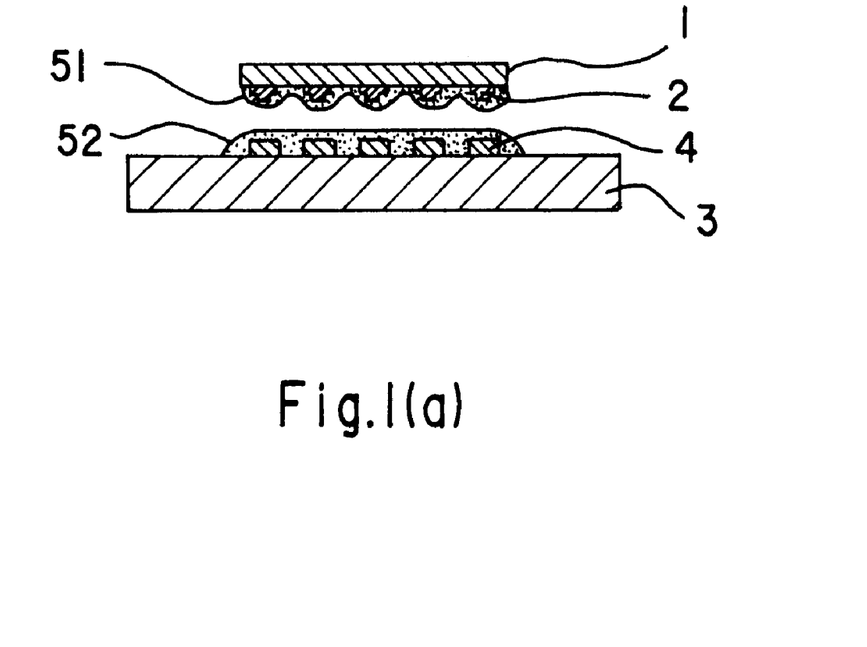
FIGS. 1(a) and 1(b) are sectional views of an essential part describing a principle of the bonding method according to the present invention.

Specifically, (1) a method in which the (meth)acrylic monomer, the peroxide, the reducing agent, the epoxy resin precursor and the curing agent are mixed in the bonding, and while the resulting mixed adhesive is interposed between the mounting substrate and the functional element, the functional element is pressed, or (2) a method in which the two-pack adhesive composed of the A agent containing the (meth) acrylic monomer, the peroxide, the epoxy resin precursor and the curing agent and the B agent composed of the reducing agent is coated such that the A agent 51 is coated on the functional element 1 and the B agent 52 on the mounting substrate 3 as shown in, for example, FIG. 1(a). In this case, the A agent and the B agent are coated so as to cover bumps 2 (lead terminals) formed on the functional element and electrodes 4 (pad portions) formed on the mounting substrate 3.

Incidentally, in the two-pack adhesive, the above-mentioned combination is not critical. For example, combinations of (1) the A agent composed of the (meth)acrylic monomer, the reducing agent, the epoxy resin precursor and the curing agent and the B agent composed of the peroxide, (2) the A agent composed of the (meth)acrylic monomer, the epoxy resin precursor and the curing agent and the B agent composed of the reducing agent and the peroxide, (3) the A agent composed of the (meth)acrylic monomer and the reducing agent and the B agent composed of the peroxide, the epoxy resin precursor and the curing agent, (4) the A agent composed of the (meth)acrylic monomer, the peroxide and the curing agent and the B agent composed of the epoxy resin precursor and the reducing agent, (5) the A agent composed of the (meth)acrylic monomer and the B agent composed of the peroxide, the reducing agent, the epoxy resin precursor and the curing agent, and the like are also usable.

Figure 1B:
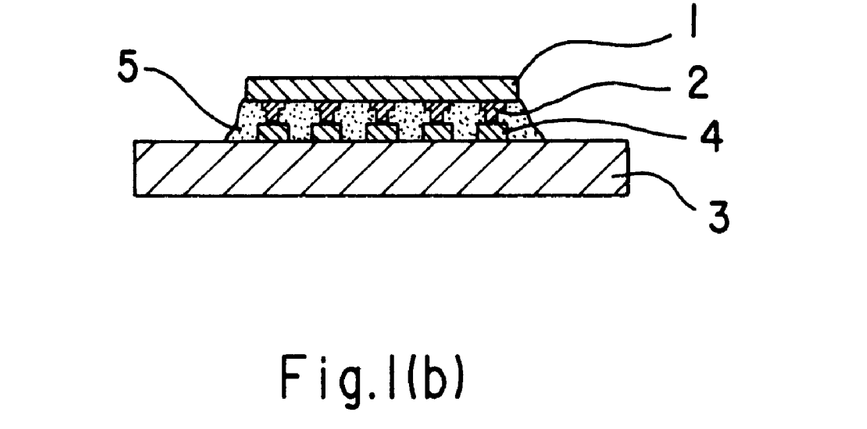

Then, such that each bump 2 of the above-mentioned functional element 1 is opposed to each corresponding electrode 4 of the wiring circuit substrate 3 as shown in FIG. 1(b), the functional element 1 is pressed on the mounting substrate 3 at room temperature. At this time, the peroxide of the A agent is contacted with the reducing agent of the B agent, and the peroxide is converted to a radical with the reducing agent. The (meth)acrylic monomer is polymerized with the peroxide converted to the radical, and an adhesive 5 causes the first curing. Accordingly, there is no need to conduct pressing with heating as in the ordinary epoxy adhesive, and it is possible to bond the functional element 1 to the mounting substrate 3 at room temperature. Consequently, an ordinary press fitted with a heating mechanism is not needed.

In the bonding method of the present invention, only the pressing is conducted at room temperature in the first curing without the heat treatment, so that there is no fear that the bonded portion might undergo a thermal stress. Therefore, even when the bonded portion is made of a material that is easy to deform, there occurs no deformation by heating. Further, it is possible to widen the margin of the conditions for the first curing that can maintain the high reliability of the bonded portion.

By the way, besides the method in which the B agent is coated on the mounting substrate and the A agent on the functional element followed by fixing, there is a method in which the A agent is coated on the mounting substrate and the B agent on the functional element followed by fixing, a method in which the A agent and the B agent are laminated and coated on the mounting substrate or the functional element and the functional element or the mounting substrate is fixed, or a method in which the A agent and the B agent are previously mixed, and the mixture is coated on the functional element and/or the mounting substrate within a usable period of time followed by fixing.

Subsequently, at least the bonded portion is heated at a temperature appropriate for curing the epoxy resin precursor. The temperature appropriate for curing varies depending on the type of the epoxy resin precursor. It is usually between about 80 and 150° C. When solid imidazole is used here as the curing agent, it is advisable to conduct heating above a temperature at which to melt imidazole. The curing agent is reacted with the epoxy resin precursor by this heating, and the epoxy resin precursor is polymerized by crosslinking to conduct the second curing. Consequently, the bonded portion which is free from a thermal stress, is excellent in the heat resistance and is good in the reliability and stable can finally be obtained.

Next, a case in which at least one of the (meth)acrylic monomer, the peroxide and the reducing agent constituting the acrylic adhesive is coated with the thermoplastic resin is described.

In this case, the (meth)acrylic monomer does not cause the curing reaction until the coating of the above-mentioned three components constituting the acrylic adhesive with the thermoplastic resin is broken. Accordingly, there is no need to separate the respective components as in the above-mentioned case in which these are not coated, nor is a method of mixing the components particularly limited. Therefore, the adhesive in this case can take any of one-pack and two-pack modes.

While the mixed adhesive is interposed between the mounting substrate and the functional element, the functional element is pressed to physically break the coating with the thermoplastic resin, so that the (meth)acrylic monomer is cured (the first curing). Here, the coating may be broken by heating the whole at a temperature at which the coating thermoplastic resin is melted simultaneously with the pressing. Then, as in the case of not coating with the thermoplastic resin, at least the bonded portion is heated to a temperature appropriate for curing of the epoxy resin precursor to conduct the second curing.

Incidentally, when the epoxy resin precursor and/or the curing agent, the component of the epoxy adhesive, is coated with the thermoplastic resin, the thermoplastic resin is melted by the heating in this second curing, and the epoxy resin precursor is contacted with the curing agent to conduct the heat-curing.

Further, when the microcapsule-type conductive filler obtained by coating the conductive fine particles with the insulating resin is added to the above-mentioned mixed adhesive, the functional element is pressed on the mounting substrate through the adhesive, and then heated, whereby the electrical connection between the fine functional element and the mounting substrate can be conducted satisfactorily and stably. Incidentally, the adhesive containing the microcapsule-type conductive filler is called an anisotropic conductive adhesive.

In the present invention, there is also provided the assembly of the mounting substrate in which the pad portions of the mounting substrate and the lead terminals of the functional element mounted thereon are electrically connected by the anisotropic conductive adhesive and the bonding method.

EXAMPLES

Examples of the present invention are specifically illustrated below using the drawings.

Example 1

FIGS. 2(a) to 2(c), FIGS. 3(a) and 3(b) are sectional views of essential parts showing the bonding method of Example 1.

In this Example, 100 parts by weight of an acrylic monomer and 1 part by weight of benzoyl peroxide (peroxide) were uniformly mixed. Subsequently, an epoxy adhesive obtained by uniformly mixing 100 parts by weight of a bisphenol F-type epoxy resin precursor with 10 parts by weight of solid imidazole was mixed with the above-mentioned mixture of the acrylic monomer and benzoyl peroxide. Further, approximately 250 parts by weight (approximately 49.9% by weight) of a filler formed of an alumina ($AlO_3$) powder having an average particle diameter of 0.5 $\mu$m were dispersed in the resulting mixed adhesive. The component obtained is called an A agent.

Meanwhile, dimethylaniline was used as a reducing agent. This reducing agent is called a B agent.

Figure 2A:
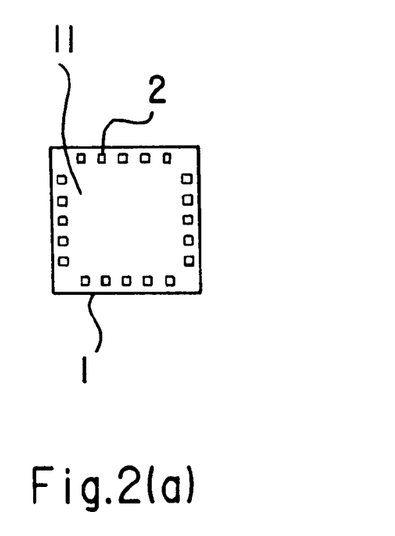
FIGS. 2(a) to 2(c) are sectional views of an essential part describing the first working example of the bonding method according to the present invention in sequence.
Figure 2B:
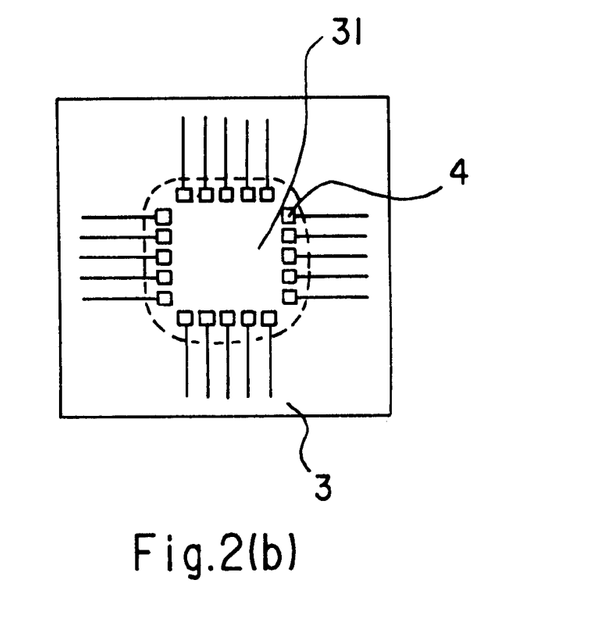

As shown in FIGS. 2(a) and 2(b), the A agent in the two-pack adhesive composed of the A agent and the B agent was coated on a predetermined region 31 (A agent coating surface) on a wiring circuit substrate (mounting substrate) 3, and the B agent was coated on a bonding surface 11 (B agent coating surface) of an integrated circuit chip (functional element) 1.

Figure 2C:
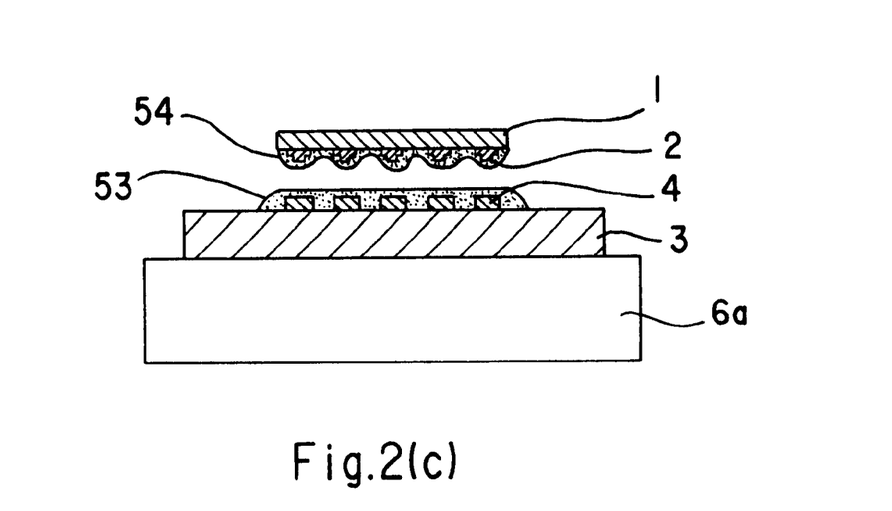
Figure 3A:
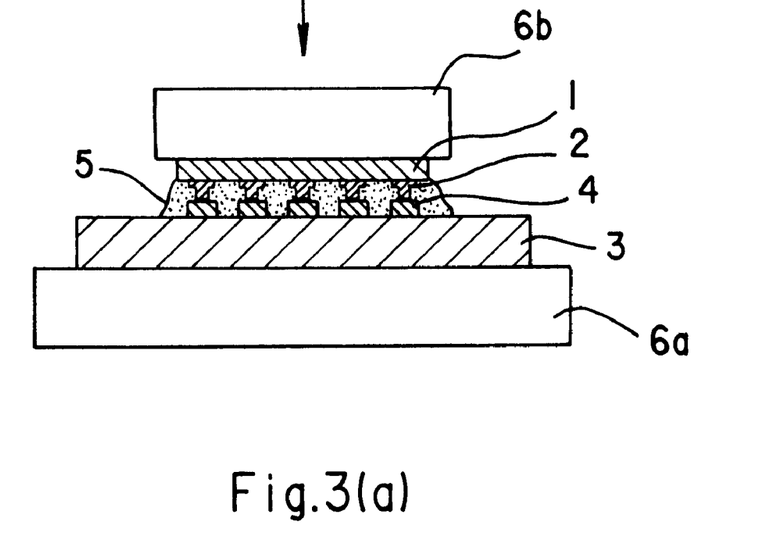
FIGS. 3(a) and 3(b) are sectional views describing the first working example of the bonding method according to the present invention in sequence after FIG. 2.

Subsequently, as shown in FIG. 2(c), electrodes 4 of the wiring circuit substrate 3 and bumps 2 of the integrated circuit chip 1 are aligned to be opposite to each other. In FIG. 2(c), reference numeral 53 indicates the A agent, and reference numeral 54 the B agent. Then, as shown in FIG. 3(a), the integrated circuit chip 1 was pressed on the wiring circuit substrate 3 in the direction shown by an arrow at room temperature and a pressure of from 5 to 7 kg/cm$^2$ with a pressing base 6a and a pressing portion 6b.

At this time, the peroxide of the A agent and the reducing agent of the B agent are brought into contact, and the peroxide was converted to a radical with the reducing agent. The peroxide converted to the radical was reacted with the acrylic monomer to conduct the first curing of the adhesive 5. The integrated circuit chip 1 was fixed on the wiring circuit substrate 3 by this first curing at room temperature. Accordingly, it was possible to conduct the fixing without imparting a thermal stress to the bonded portion.

Figure 3B:
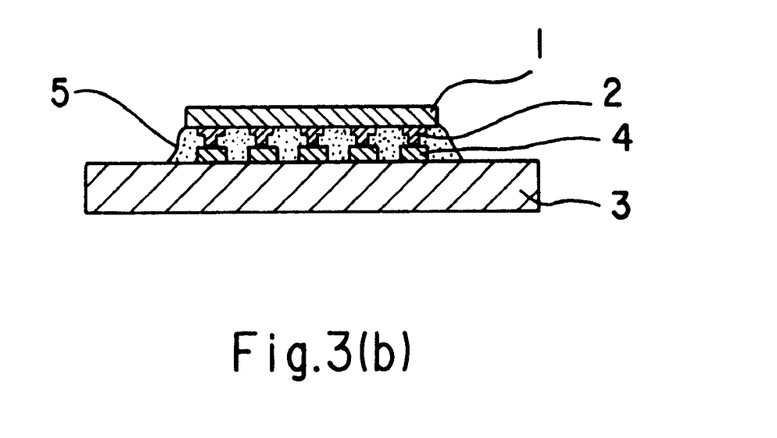

The wiring circuit substrate 3 on which the integrated circuit chip 1 was fixed by the first curing was heated from the side of the integrated circuit chip 1 at 150° C. for approximately 2 hours (refer to FIG. 3(b)). The epoxy resin precursor was heat-cured (second curing) by this heating. As a result, the bonded portion requiring conduction was free from poor conduction, and the insulation resistance of $10^8$ $\Omega$ or more was exhibited in the bonded portion not requiring conduction. Further, the bonded portion was free from a thermal stress, excellent in the heat resistance, and good in the reliability.

Moreover, the conduction test and the insulation test were conducted using the above-mentioned A agent and B agent. The test conditions are described below.

First, the two-pack adhesive composed of the above-mentioned A agent and B agent in the combination shown in Table 1 was coated on a predetermined surface of an integrated circuit chip 1 cm² square and a predetermined region of a wiring circuit substrate (having 238 electrode terminals mounted at a pitch of 125 μm) made of a glass epoxy respectively.

TABLE 1

| Sample | Component coated on a surface of an integrated circuit chip | Component coated on a surface of a wiring circuit substrate |
|---|---|---|
| No. 1 | B agent | A agent |
| No. 2 | A agent | B agent |

The bumps on the coated surface of the integrated circuit chip and the electrodes on the coated surface of the wiring circuit substrate were aligned. Further, the integrated circuit chip was pressed on the wiring circuit substrate with a press at a pressure of from 5 to 7 kg/cm² to cure the acrylic monomer component of the above-mentioned adhesive and fix the integrated circuit chip and the wiring circuit substrate at room temperature. By the way, a case in which the A agent was coated on the integrated circuit chip side and the B agent on the wiring circuit substrate side was designated Sample No. 1, and a case in which the A agent was coated on the wiring circuit substrate side and the B agent on the integrated circuit chip side was designated Sample No. 2. Further, 20 pieces of each of Sample No. 1 and Sample No. 2 were produced.

Then, each of Sample No. 1 and Sample No. 2 was heated at 150° C. for 2 hours to heat-cure the epoxy resin precursor. With respect to the resulting Sample No. 1 and Sample No. 2, a conduction test and an insulation test were conducted.

The conduction test was conducted by applying a DC voltage of 5 V between the bumps and the electrodes of the integrated circuit chip and the wiring circuit substrate under environment of 85° C. and a humidity of 85% for 500 hours, and then measuring the resistance of the conductive portion. As a result of the measurement, the adhesive was judged to be an appropriate one so long as the increase in the resistance of the conductive portion was within 10%.

The insulation test was conducted by applying a voltage under the same conditions as in the above-mentioned conduction test and then measuring the resistance of the insulating portion. As a result of the measurement, the adhesive was judged to be an appropriate one so long as the resistance of the insulating portion was $10^8$ Ω or more.

The temperature cycle test was conducted by defining the cooling at −50° C. and the heating at 125° C. as one cycle, repeating this one cycle 500 times and then measuring the resistance of the conductive portion and the insulating portion. As a result of the measurement, the adhesive was judged to be an appropriate one so long as the increase in the resistance of the conductive portion was within 10% and the resistance of the insulating portion was $10^8$ Ω or more.

The results of the above-mentioned tests are shown in Table 2.

TABLE 2

| | Samples | |
|---|---|---|
| | No. 1 | No. 2 |
| Results of conduction test (number of poor results/number of tests) | 0/20 | 0/20 |
| Results of insulation test (number of poor results/number of tests) | 0/20 | 0/20 |
| Results of temperature cycle test (number of poor results/number of tests) | 0/20 | 0/20 |

As is apparent from Table 2, the good results were obtained such that none of the samples showed poor conduction and the insulation resistance was $10^8$ Ω or more. In the results of the temperature cycle test as well, poor conduction and poor insulation did not occur at all, nor was a poor bonded portion owing to deterioration observed. Accordingly, the bonding with the quite good heat resistance was provided.

Although the curing of the epoxy resin precursor was conducted under heating conditions of 150° C. and 2 hours in the above-mentioned bonding, the above-mentioned temperature cycle test was conducted in which the heating conditions were replaced with 70° C. and 2 hours, 70° C. and 4 hours, 80° C. and 2 hours, 80° C. and 4 hours, 100° C. and 2 hours, and 120° C. and 2 hours. The results are shown in Table 3.

TABLE 3

| | Heating conditions | | Results of temperature cycle test |
|---|---|---|---|
| Sample | Temperature | Time | (number of poor results/number of tests) |
| No. 1 | 70° C. | 2 hours | 7/20 |
| | 70° C. | 4 hours | 8/20 |
| | 80° C. | 2 hours | 0/20 |
| | 80° C. | 4 hours | 0/20 |
| | 100° C. | 2 hours | 0/20 |
| | 120° C. | 2 hours | 0/20 |
| | 150° C. | 2 hours | 0/20 |
| No. 2 | 70° C. | 2 hours | 6/20 |
| | 70° C. | 4 hours | 9/20 |
| | 80° C. | 2 hours | 0/20 |
| | 80° C. | 4 hours | 0/20 |
| | 100° C. | 2 hours | 0/20 |
| | 120° C. | 2 hours | 0/20 |
| | 150° C. | 2 hours | 0/20 |

As is apparent from this Table 3, when the heating condition was 70° C., poor conduction and poor insulation owing to the heat deterioration in the bonded portion occurred in both Sample No. 1 and Sample No. 2. Accordingly, the heating temperature was found to be preferably 80° C.

By the way, the tests were conducted in the same manner as mentioned above except that cumene hydroperoxide was used as a peroxide and ferrous sulfide ($FeSO_4$) as a reducing agent. Consequently, the results were good as mentioned above.

Example 2

One hundred parts by weight of an acrylic monomer, 5 parts by weight, per 100 parts by weight of the acrylic monomer, of a reducing agent, 100 parts by weight of an epoxy resin precursor and 10 parts by weight, per 100 parts by weight of the epoxy resin precursor, of solid imidazole in Example 1 were uniformly mixed to obtain an A agent.

Subsequently, a B component composed mainly of a peroxide (5 parts by weight per 100 parts by weight of the acrylic monomer) was obtained. The conduction test, the insulation test and the temperature cycle test were conducted as in Example 1 using this two-pack adhesive. By the way, as the peroxide and the reducing agent, a combination of benzoyl peroxide and dimethylaniline and a combination of cumene hydroperoxide and ferrous sulfide were used.

Also in Example 2, as in Example 1, the bonded portion was free from a thermal stress, and as a result of the tests, the bonding with the good conduction, the good insulation resistance and the excellent heat resistance was obtained.

Example 3

The conduction test, the insulation test and the temperature cycle test were conducted as in Example 2 except that the acrylic monomer, the epoxy resin precursor and the curing agent were contained in the A agent and the peroxide and the reducing agent were contained in the B agent.

Also in Example 3, as in Examples 1 and 2, the bonded portion was free from a thermal stress, and as a result of the tests, the bonding with the good conduction, the good insulation resistance and the excellent heat resistance was obtained.

Example 4

The conduction test, the insulation test and the temperature cycle test were conducted as in Example 2 except that the acrylic monomer and the curing agent were contained in the A agent and the epoxy resin precursor, the curing agent and the peroxide were contained in the B agent.

Also in Example 4, as in Examples 1 to 3, the bonded portion was free from a thermal stress, and as a result of the tests, the bonding with the good conduction, the good insulation resistance and the excellent heat resistance was obtained.

Example 5

The conduction test, the insulation test and the temperature cycle test were conducted as in Example 2 except that the acrylic monomer, the peroxide and the curing agent were contained in the A agent and the epoxy resin precursor and the reducing agent were contained in the B agent.

Also in Example 5, as in Examples 1 to 4, the bonded portion was free from a thermal stress, and as a result of the tests, the bonding with the good conduction, the good insulation resistance and the excellent heat resistance was obtained.

Example 6

The conduction test, the insulation test and the temperature cycle test were conducted as in Example 2 except that the acrylic monomer was contained in the A agent and the epoxy resin precursor, the curing agent, the reducing agent and the peroxide were contained in the B agent.

Also in Example 6, as in Examples 1 to 5, the bonded portion was free from a thermal stress, and as a result of the tests, the bonding with the good conduction, the good insulation resistance and the excellent heat resistance was obtained.

Example 7

One hundred parts by weight of an acrylic monomer (3921 made by Three Bond or 326 LVUV made by Nippon Locktight) and an epoxy adhesive obtained by uniformly mixing 100 parts by weight of an epoxy resin precursor with 10 parts by weight, per 100 parts by weight of the epoxy resin precursor, of the curing agent used in Example 1 were mixed. In the resulting mixture were further dispersed 40% by weight, in terms of a weight ratio, of a microcapsule-type conductive filler obtained by coating surfaces of silver fine particles having an average particle diameter of approximately 7 $\mu$m with an insulating resin obtained by the reaction of an epoxy resin with an amine compound such as tetraethylenepentaamine, hexamethylenediamine or the like and 30% by weight, in terms of a weight ratio, of a silica ($SiO_2$) powder to obtain an A agent.

Meanwhile, a redox initiator (3941 made by Three Bond or TDS-7649 made by Nippon Locktight), a combination of a peroxide made of benzoyl peroxide and a reducing agent made of dimethylaniline or a combination of a peroxide made of cumene hydroxyperoxide and ferrous sulfide, was used as a B agent.

Subsequently, in the two-pack anisotropic conductive adhesive composed of the A agent and the B agent, the A agent was coated on a predetermined region of a wiring circuit substrate, and the B agent was coated on a bonding surface of an integrated circuit chip.

Then, electrodes of the wiring circuit substrate and bumps of the integrated circuit chip were aligned to be opposite to each other, and the integrated circuit chip was pressed on the wiring circuit substrate with a press at room temperature and a pressure of from 5 to 7 kg/$cm^2$.

At this time, the microcapsule portion of the microcapsule-type conductive filler in the A agent held between the electrodes of the wiring circuit substrate side and the integrated circuit chip side was broken, and the silver fine particles therein flowed out. As a result, the silver fine particles were held between the electrodes of the wiring circuit substrate side and the bumps of the integrated circuit chip side, and only these two were selectively bonded conductively. Further, the peroxide converted to the radical with the reducing agent of the B agent was reacted with the acrylic monomer of the A agent to conduct the first curing, and the integrated circuit chip was fixed on the wiring circuit substrate at room temperature. The fixed portion did not undergo a thermal stress.

Thereafter, the wiring circuit substrate on which the integrated circuit chip was fixed by the first curing was heated at 100° C. for 2 hours. The thermoplastic resin coating the curing agent was heat-dissolved by this heating to cause the curing agent to flow out, and the curing agent was reacted with an epoxy resin precursor to cure the epoxy resin precursor (second curing). Consequently, as in Example 1, the bonded portion requiring conduction was free from poor conduction, and the insulation resistance of $10^8$ $\Omega$ or more was shown in the bonded portion not requiring conduction. Further, the bonded portion was free from a thermal stress, excellent in the heat resistance, and also good in the reliability.

Moreover, the conduction test, the insulation test and the temperature cycle test were conducted in the same manner as in Example 1. Consequently, as in Example 1, the bonded portion was free from a thermal stress. Further, as a result of the tests, the bonding with the good conduction, the good insulation resistance and the excellent heat resistance was obtained.

Examples 8 to 12

The conduction test, the insulation test and the temperature cycle test were conducted as in Example 7 except that the acrylic monomer, the peroxide, the reducing agent, the epoxy resin precursor, the curing agent and the microcapsule-type conductive filler were combined as mentioned below. Consequently, as in Example 1, the bonded portion was free from a thermal stress, and as a result of the tests, the bonding with the good conduction, the good insulation resistance and the excellent heat resistance was obtained.

(1) two-pack anisotropic adhesive of the A agent composed of the acrylic monomer, the epoxy resin precursor, solid imidazole, the peroxide and the microcapsule-type conductive filler and the B agent composed of the reducing agent (Example 8)

(2) two-pack anisotropic adhesive of the A agent composed of the acrylic monomer, the epoxy resin precursor, solid imidazole, the reducing agent and the microcapsule-type conductive filler and the B agent composed of the peroxide (Example 9)

(3) two-pack anisotropic conductive adhesive of the A agent composed of the acrylic monomer and the reducing agent and the B agent composed of the epoxy resin precursor, solid imidazole, the peroxide and the microcapsule-type conductive filler (Example 10)

(4) two-pack anisotropic conductive adhesive of the A agent composed of the acrylic monomer, the peroxide and the microcapsule-type conductive filler and the B agent composed of the epoxy resin precursor, solid imidazole and the reducing agent (Example 11)

(5) two-pack anisotropic conductive adhesive of the A agent composed of the acrylic monomer and the microcapsule-type conductive filler and the B agent composed of the epoxy resin precursor, solid imidazole, the reducing agent and the peroxide (Example 12)

Examples 13 to 19

Seven types of adhesives having the following compositions were prepared.

(1) the acrylic monomer coated with the thermoplastic resin, benzoylperoxide (peroxide), dimethylaniline (reducing agent), the epoxy resin precursor, solid imidazole and alumina (filler) (Example 13)

(2) the acrylic monomer coated with the thermoplastic resin, benzoyl peroxide coated with the thermoplastic resin, dimethylaniline, the epoxy resin precursor, solid imidazole and alumina (Example 14)

(3) the acrylic monomer coated with the thermoplastic resin, benzoyl peroxide coated with the thermoplastic resin, dimethylaniline coated with the thermoplastic resin, the epoxy resin precursor, solid imidazole and alumina (Example 15)

(4) the acrylic monomer coated with the thermoplastic resin, benzoyl peroxide, dimethylaniline coated with the thermoplastic resin, the epoxy resin precursor, solid imidazole and alumina (Example 16)

(5) the acrylic monomer, benzoyl peroxide coated with the thermoplastic resin, dimethylaniline, the epoxy resin precursor, solid imidazole and alumina (Example 17)

(6) the acrylic monomer, benzoyl peroxide coated with the thermoplastic resin, dimethylaniline coated with the thermoplastic resin, the epoxy resin precursor, solid imidazole and alumina (Example 18)

(7) the acrylic monomer, benzoyl peroxide, dimethylaniline coated with the thermoplastic resin, the epoxy resin precursor, solid imidazole and alumina (Example 19)

By the way, the amounts of the respective components were that per 100 parts by weight of the acrylic monomer, the peroxide was 10 parts by weight, the reducing agent 10 parts by weight, the epoxy resin precursor 100 parts by weight, and solid imidazole 10 parts by weight. Further, alumina was added in an amount of 50% by weight based on the overall adhesive.

With respect to the above-mentioned adhesives, the conduction test and the insulation test were conducted as in Example 1. The results are shown in Table 4.

TABLE 4

| Sample | Results of conduction test (number of poor results/ number of tests) | Results of insulation test (number of poor results/ number of tests) |
|---|---|---|
| Adhesive (1) | 0/20 | 0/20 |
| Adhesive (2) | 0/20 | 0/20 |
| Adhesive (3) | 0/20 | 0/20 |
| Adhesive (4) | 0/20 | 0/20 |
| Adhesive (5) | 0/20 | 0/20 |
| Adhesive (6) | 0/20 | 0/20 |
| Adhesive (7) | 0/20 | 0/20 |

As is apparent from Table 4, the good results were provided such that none of the samples showed poor conduction and the insulation resistance was 108 or more.

Further, the conduction test and the insulation test were conducted as mentioned above except that the epoxy resin precursor was heat-cured under heating conditions shown in Table 5.

TABLE 5

| Heating conditions | |
|---|---|
| Temperature | Time |
| 120° C. | 2 hours |
| 100° C. | 2 hours |
| 80° C. | 2 hours |
| 80° C. | 4 hours |
| 70° C. | 2 hours |
| 70° C. | 4 hours |

As a result, when the curing was conducted at 70° C, slightly poor insulation and slightly poor conduction occurred. Accordingly, it was found that the heat-curing was preferably conducted at 80° C. or more.

By the way, the tests were conducted in the same manner as mentioned above except that cumene hydroperoxide was used as a peroxide and ferrous sulfide ($FeSO_4$) as a reducing agent. Consequently, the results were good as mentioned above.

Example 20

The conduction test and the insulation test were conducted in the same manner as in Example 7 except that a microcapsule-type conductive filler formed by coating surfaces of silver fine particles having an average particle diameter of from approximately 5 to 10 $\mu$m with an insulating resin obtained by the reaction of an epoxy resin and an amine compound such as tetraethylenepentaamine, hexamethylenediamine or the like was added to each of the adhesives in Examples 13 to 19 in an amount of 60% by weight in terms of a weight ratio. In all the samples, good results were obtained such that no poor conduction was provided and the insulation resistance was $10^8$ Ω or more.

As is apparent from the foregoing description, the adhesive according to the present invention is the mixed adhesive containing the acrylic adhesive and the epoxy adhesive, and in the bonding method of the present invention, the mixed adhesive is used by being coated between two members to be bonded. Therefore, the (meth)acrylic monomer contained in the acrylic adhesive is redox-polymerized by pressing this adhesive at room temperature to conduct the first curing. In this curing, the heating which was conducted so far is unnecessary as usual, so that the bonded portion can be fixed without a thermal stress.

Moreover, when the anisotropic conductive adhesive containing the microcapsule-type conductive filler is used, the microcapsule is broken by the pressing in the bonding, and the conductive bonded portion free from a thermal stress can be formed with the conductive filler which flows out.

In addition, the epoxy resin precursor contained in the epoxy adhesive is contacted with the curing agent by the heating after the first curing to conduct the second coating. This second coating makes it possible to finally obtain the stable bonding free from the thermal stress with the excellent heat resistance and the good reliability.

Accordingly, it is quite advantageous that the bonding method of the present invention is applied to a bonding step (especially a fine pitch bonding) of a functional element such as an integrated circuit chip or the like and a mounting substrate such as a wiring circuit substrate or the like. Further, since the bonding free from the thermal stress with the excellent heat resistance can be realized at room temperature, it can be applied to a wide variety of bonding usages other than the above-mentioned usage, for example, in the fields in which a step of easily bonding components of a component assembly at room temperature is required, and excellent results are brought forth in practice.

Moreover, the assembly of the mounting substrate can be obtained in which the pad portions of the mounting substrate and the lead terminals of the functional element mounted thereon are electrically connected by the above-mentioned anisotropic conductive adhesive and bonding method.

What is claimed is:

1. A bonding method for electronically bonding a pad portion of a mounting substrate and a lead terminal of a functional element with an anisotropic conductive adhesive, said method consisting of the steps of:
    a) preparing a two pack adhesive of an A agent composed of an acrylic monomer, dimethylaniline, an epoxy resin precursor, solid imidazole and a microcapsule conductive tiller, and a B agent composed of benzoyl peroxide;
    b) adhering and fixing said mounting substrate and said functional element by applying the A agent and the B agent between the pad portion and the lead terminal at room temperature; and
    c) curing said epoxy resin precursor by action of the solid imidazole under a heat-curing condition of a temperature from 80 to 150° C.

2. The bonding method as claimed in claim 1, wherein said microcapsule conductive filler is obtained by coating conductive fine particles with an insulating resin.

3. The bonding method as claimed in claim 1, wherein the solid imidazole is coated with a thermoplastic resin to form microcapsules.

4. The bonding method as claimed in claim 1, wherein the acrylic monomer is mixed in a proportion of from 0.1 to 500 parts by weight per 100 parts by weight of the epoxy resin precursor.

5. The bonding method as claimed in claim 1, wherein at least one of the acrylic monomer, the benzoyl peroxide and the dimethylaniline is coated with a thermoplastic resin to form a microcapsule.

6. A bonding method for electrically bonding a pad portion of a mounting substrate and a lead terminal of a functional element with an anisotropic conductive adhesive, said method consisting of the steps of:
    a) preparing a two pack adhesive of an A agent composed of an acrylic monomer, an epoxy resin precursor, solid imidazole and a microcapsule conductive filler, and a B agent composed of benzoyl peroxide and dimethylaniline;
    b) adhering and fixing said mounting substrate and said functional element by applying the A agent and the B agent between the pad portion and the lead terminal at room temperature and
    c) curing said epoxy resin precursor by action of the solid imidazole under a heat-curing condition of a temperature from 80 to 150° C.

7. The bonding method as claimed in claim 6, wherein at least one of the acrylic monomer, the benzoyl peroxide and the dimethylaniline is coated with a thermoplastic resin to form a microcapsule.

8. The bonding method in claim 6, wherein said microcapsule conductive filler is obtained by coating conductive fine particles with an insulating resin.

9. The bonding method as claimed in claim 6, wherein the solid imidazole is coated with a thermoplastic resin to form a microcapsule.

10. The bonding method as claimed in claim 6, wherein the acrylic monomer is mixed in a proportion of from 0.1 to 500 parts by weight per 100 parts by weight of the epoxy resin precursor.

11. A bonding method for electronically bonding a pad portion of a mounting substrate and a lead terminal of a functional element with an anisotropic conductive adhesive, said method consisting of the steps of:
    a) preparing a two pack adhesive of an A agent composed of an acrylic monomer, ferrous sulfide, an epoxy resin precursor, solid imidazole and a microcapsule conductive filler, and a B agent composed of cumene hydroperoxide;
    b) adhering and fixing said mounting substrate and said functional element by applying the A agent and the B agent between the pad portion and the lead terminal at room temperature; and
    c) curing said expoxy resin percursor by action of the solid imidazole under a heat-curing condition of a temperature from 80 to 150° C.

12. A bonding method for electrically bonding a pad portion of a mounting substrate and a lead terminal of a functional element with an anisotropic conductive adhesive, said method consisting of the steps of:
    a) preparing a two pack adhesive of an A agent composed of an acrylic monomer, an epoxy resin precursor, solid imidazole and a microcapsule conductive filler, and a B agent composed of cumene hydroperoxide and ferrous sulfide;
    b) adhering and fixing said mounting substrate and said functional element by applying the A agent and the B agent between the pad portion and the lead terminal at room temperature; and
    c) curing said epoxy resin precursor by action of the solid imidazole under a heat-curing condition of a temperature from 80 to 150° C.

* * * * *